United States Patent [19]

Koopman et al.

[11] Patent Number: 5,407,121
[45] Date of Patent: Apr. 18, 1995

[54] FLUXLESS SOLDERING OF COPPER

[75] Inventors: Nicholas G. Koopman; Sundeep Nangalia, both of Raleigh, N.C.

[73] Assignee: MCNC, Research Triangle Park, N.C.

[21] Appl. No.: 155,020

[22] Filed: Nov. 19, 1993

[51] Int. Cl.$^6$ .............................................. B23K 1/20
[52] U.S. Cl. ................................... 228/206; 228/254; 228/262.61; 427/123
[58] Field of Search ..................... 228/179.1, 203, 205, 228/206, 254, 262.61; 427/123, 383.7, 404, 405

[56] References Cited

U.S. PATENT DOCUMENTS

| | | | |
|---|---|---|---|
| 4,012,307 | 3/1977 | Phillips | 156/644 |
| 4,081,121 | 3/1978 | Picard . | |
| 4,328,044 | 5/1982 | Chasteen | 228/206 |
| 4,405,379 | 9/1983 | Chasteen . | |
| 4,498,046 | 2/1985 | Faris et al. . | |
| 4,504,007 | 3/1985 | Anderson, Jr. et al. . | |
| 4,577,398 | 3/1986 | Sliwa et al. . | |
| 4,921,157 | 5/1990 | Dishon et al. . | |
| 5,192,582 | 3/1993 | Liedke et al. | 228/206 |

FOREIGN PATENT DOCUMENTS

| | | | |
|---|---|---|---|
| 0003660 | 8/1979 | European Pat. Off. | 228/206 |
| 0034041 | 8/1981 | European Pat. Off. . | |
| 3442538 | 7/1985 | Germany . | |

OTHER PUBLICATIONS

Genieys, E., British Association for Brazing and Soldering, "Brazing in Reducing Fluoride Containing Atmospheres", London, Nov. 1972.

IBM Technical Disclosure Bulletin, vol. 27, No. 11, Apr. 1985—"Dry Soldering Process Using Halogenated Gas".

Moskowitz and Yeh, "Thermal Dry Process Soldering", J. Vac. Sci. Technol. A., vol. 4, No. 3, May/Jun. 1986.

Moskowitz and Davidson, "Summary Abstract: Laser—Assisted Dry Process Soldering", J. Vac. Sci. Technol. A., vol. 3, May/Jun. 1985.

J. Licari and L. Enlow, Hybrid Microcircuit Technology Handbook, Noyes Publications, New Jersey, 1988, p. 235.

C. Mackay, Flux Reactions and Solderability in Solder Joint Reliability, J. Lau–Editor, Van Nostrand Reinhold, N.Y., 1991, pp. 2, 73–80.

H. Manko, Solders and Soldering, McGraw Hill, N.Y., 1992, pp. 380–381, 156–158, 373, 375, 160–161.

*Primary Examiner*—Samuel M. Heinrich
*Attorney, Agent, or Firm*—Bell, Seltzer, Park & Gibson

[57] ABSTRACT

A method of soldering a copper layer without the use of fluxing agents by exposing the copper layer to a fluorine-containing plasma. Solder is then placed onto the surface of the copper layer and reflowed. Reflow can take place at low temperatures, atmospheric pressure and in an inert or oxidizing atmosphere using standard solder reflow equipment.

23 Claims, 4 Drawing Sheets

FLUXLESS SOLDERING OF COPPER

FIELD OF THE INVENTION

The present invention relates to a method for soldering, and more particularly to a soldering method for copper.

BACKGROUND OF THE INVENTION

In fabricating electronic systems, integrated circuits ("chips") or other electrical devices are mounted on printed wiring boards, or other substrates. The contact between the chip and substrate must have physical, chemical and electrical integrity and stability. Copper is particularly useful as a layer in microelectronic devices, because of its good conductivity properties.

In one technique for physically and electrically connecting microelectronic devices, metal pads are fabricated on an exposed surface of a substrate. These metal pads are often formed with a top layer of solder, i.e., a low melting point alloy, usually of the lead-tin type, used for joining metals at temperatures about 230° C. The solder pads are brought into contact with a metal structural element that will be wet with liquid solder when heat is applied to join the solder and the metal pad and thereby form the electrical connection. Other techniques use a solder preform which is placed between the substrate and device. Yet other techniques use solder bumps which are applied to the device or to the substrate.

Typically, soldering processes include three basic steps: (1) pre-cleaning and deoxidation of surface oxides; (2) solder reflow and/or reflow joining; and (3) post-soldering cleaning. Different flux materials are used in the pre-cleaning step to prepare the surfaces for the soldering step by removal of contaminants and metal oxides from the solder surface. For example, activated fluxes, such as zinc, ammonium chloride, mineral acid-containing materials, and the like, are typically used in "coarse" soldering applications, i.e., repairing coarse wiring in motors or houses. The solder joining step can occur only after the oxide coating is removed because the high melting point oxides will prevent wetting of the two surfaces to be joined by reflow of solder. The third step, post-soldering cleaning, removes flux residue remaining after the reflow.

Highly acidic fluxes are used for the soldering of aluminum layers. Aluminum has a tenacious oxide layer which is chemically very inert and difficult to remove. Thus, mild rosin fluxes are ineffective with aluminum, and special fluxes containing acid compounds which are highly corrosive, such as inorganic acids in a cadmium fluoroborate vehicle, must be used. Fluxes used with aluminum can also contain metal chlorides, fluorides, and ammonium compounds.

Because of the gross corrosive nature of these fluxes, and the high attack rates on metals in microelectronic assemblies, such fluxes cannot be used in microelectronics. For microelectronic devices, the standard practice is to reduce the acid activity of the flux to a mildly activated or non-activated grade in an attempt to minimize the adverse effects of the flux on the components. Typical soldering processes for copper layers in microelectronic applications use rosins which form a very mild organic acid when melted at the soldering temperature but which are relatively inert at room temperature.

Although corrosion and other risks can be minimized in copper soldering applications using mild flux agents, flux is necessary to keep the solder from oxidizing, allow it to flow and wet the parts being soldered. In addition, with the shrinking size of all electronic components and bonding pads, the rapidly growing use of surface mount technology, and the increasing demand for flip-chip device bonding, the post reflow cleaning of flux residues is becoming increasingly difficult. The small gaps between assembled parts, and solidification cavities in mixed soldered joints are very resistant to penetration by cleaning liquids. Inefficient post-soldering cleaning can reduce the long term reliability of the whole assembly. Further, there can be other problems associated with non-activated or mildly activated flux processes, such as higher defect levels and high rework costs. Optoelectronic devices are also very sensitive to flux residues due to absorption and bending of the optical signals.

A fluxless soldering process, particularly for soldering microelectronic devices including a copper layer, therefore can have several advantages. A dry or fluxless soldering process can replace the pre-cleaning step and totally eliminate the post-soldering cleaning step. Fluxless soldering has also gained increasing importance in recent years due to concerns for the environmental effect of common cleaning agents, such as chlorofluorocarbons.

Various attempts at fluxless soldering have been made but with limited success. Some fluxless processes have used halogenated gases. For example, P. Moskowitz et al., J.Vac.Sci.Tech. 4, (May/June 1986) describe a dry soldering process for solder reflow and bonding of lead/tin solder. The process uses halogen-containing gases to reduce the surface oxide to enable solder reflow at temperatures above the solder-melting point. The activation energy needed for the oxide reduction by these gases is lowered by use of a catalyst, platinum mesh, in a vacuum chamber. Yet the temperature needed for successful reflow bonding is 300° C., well above typical soldering temperatures for most electronic applications of about 220° C. Thus, this process can damage the components, the substrate, and generate defects due to thermal mismatch between different materials.

IBM Technical Disclosure Bulletin 27 (April 1985) describes the use of halogenated gases in an inert carrier gas at elevated temperatures to produce a reduction of solder oxide by the reactive gas and to allow solder reflow. Again, for the more common low temperature applications, thermal damage may result.

P. Moskowitz et al., J.Vac. Sci.Tech. 3 (May/June 1985) describe a laser-assisted fluxless soldering technique for solder reflow. This technique uses laser radiation to excite an otherwise nonreactive gas in the presence of preheated solder surface. This technique requires direct access of the laser beam to the solder surface, thus limiting the applications as well as resulting in a low throughput process.

U.S. Pat. No. 4,921,157 discloses a fluxless soldering process for semiconductor devices. In the process, solder surface oxides are removed using a plasma process. Solder having a surface oxide layer is deposited onto a surface and fluorine-containing plasma excitation is performed on the solder. The solder is then reflowed.

German Patent No. 3,442,538 discloses a method of soldering semiconductor elements wherein a semiconductor element having an aluminum layer is subjected to a fluorine-containing plasma. The treated aluminum surface is then contacted with a soft solder. Process conditions include treating the aluminum layer with a fluorine-containing plasma for at least 1 hour in a vacuum at a temperature of about 147° C. to 397° C. Alternative process conditions use a standard soldering iron, presumably in the presence of flux, to remove oxides. Further, as with several of the processes described above, the temperatures used are well above typical soldering temperatures for most electronic applications, and can result in damage to the components.

The types of fluxes and flux conditions used for aluminum are very different than those used for copper soldering. Because of the nature of the tarnish finish of copper, mild rosin fluxes can be used. Copper forms only a mild galvanic cell with solder due to their close electromotive potentials (0.13 vs. −0.34 for tin and copper, respectively). Thus the corrosion risk for soldered copper is very low when mild rosin fluxes are used. Further, the attack of the copper and solder and other fine metal features of the microelectronic circuit is low enough to be acceptable in most soldering processes. See H. Manko, Solders and Soldering (McGraw Hill New York 1992), pp. 380–381; 156–158.

In contrast, aluminum has a tenacious surface oxide layer which is difficult to remove and which is chemically very inert. Special fluxes are used for aluminum which contain highly corrosive acid compounds, such as inorganic acids in a cadmium fluoroborate vehicle. Fluxes used with aluminum can also contain metal chlorides, fluorides, and ammonium compounds. The flux mechanism usually involves aluminum attack, forming aluminum chlorides which are gaseous at the soldering temperature and help disperse the oxide layer of the aluminum surface. Because of the gross corrosive nature of the fluxes, and the high attack rate on metals in microelectronic assemblies, these fluxes cannot be used for copper or in microelectronic applications. The particular combination of lead tin solder and aluminum is also very bad from a galvanic standpoint in that the potential difference between the solder and the aluminum (1.53 v) exceeds the tolerable range and fast deterioration of the joint occurs under humid conditions. See H. Manko, Solders and Soldering (McGraw Hill New York 1992), pp. 373–375.

Thus fluxes and conditions for the soldering of aluminum are very different than for the soldering of copper. H. Manko, Solders and Soldering (McGraw Hill New York 1992), pp. 160–161. What works for one will not work for the other, and vice versa. This is also true of controlled atmosphere soldering which makes use of reducing gases such as hydrogen or carbon monoxide, or organic acid gases such as formic acid or acetic acids. These have been demonstrated to have some applicability to copper but are woefully inadequate on aluminum. Thus it is not expected that a technique to solder aluminum would work with copper. In fact, one skilled in the art would expect just the opposite. See C. Mackay, Flux Reactions and Solderability in Solder Joint Reliability, J. Lau Editor (Van Nostrand Reinhold, New York, 1991), pp. 73–80.

SUMMARY OF THE INVENTION

It is therefore an object of the present invention to provide an improved soldering process.

It is another object of the present invention to provide an improved fluxless soldering process.

It is another object of the present invention to provide an improved fluxless soldering process for a copper layer.

It yet another object of the present invention to provide a soldering process without the need for post-soldering clean up.

It is yet another object of the present invention to provide a pre-soldering process for improved solder flow.

It is yet another object of the present invention to provide an improved fluxless soldering process which can occur at a low temperature.

These and other objects of the present invention are accomplished by pre-treating a copper layer to be soldered. Typically, a flux agent is required to effectively solder a copper surface because of the presence of oxide compounds on the surface of the copper layer. These oxides must be removed before reflow/wetting can occur. In the present invention, the surface of the copper layer is pretreated prior to soldering under conditions sufficient to convert at least some of the copper surface oxides to a compound which permits solder reflow without the use of flux agents.

Specifically, in the invention, an exposed surface of a copper layer is pre-treated via a plasma treatment using fluorinated gases, such as $SF_6$, $CF_4$, and the like. The fluorinated gas is excited to form a fluorine-containing plasma, and the copper layer is exposed to the gases downstream from the fluorine-containing plasma. The gases from the fluorine-containing plasma are believed to act upon surface oxide compounds found on the surface of the copper layer, converting the oxide compounds to fluorine-containing compounds. After the pre-treatment step, solder is placed onto the surface of the copper layer and reflowed.

The process conditions of the present invention are flexible and can be selected to optimize solder reflow. For example, the pretreatment of the copper layer can be conducted at low temperatures, i.e., from about 20° C. to 24° C. Alternatively, the copper layer can be pre-treated at elevated temperatures up to about 120° C. In addition, plasma treatment times can be short, i.e., about 2 to 30 minutes. In a preferred embodiment of the invention, the exposed surface of the copper layer is exposed to a fluorine-containing plasma at a pressure from 400 mtorr to 800 mtorr and at a temperature from 20° C. to 120° C. for a period of 15 minutes. The exposing step results in a fluorine/oxygen ratio on the copper surface of about 2/1 to about 8/1.

The pre-treatment of the copper layer in a downstream fluorine-containing plasma does not have to be coupled to the reflow process. After the pre-treatment step, copper samples can be stored in air, for up to one week, before the reflow/join operation is performed. Alternatively, the pretreated copper layer can be stored in an inert ambient, such as nitrogen, for up to 2 weeks, before the reflow/join operation is performed. Thus existing soldering tools can be used.

After the pre-treatment step, solder is placed onto the surface of the copper layer and reflowed. In contrast to prior techniques for soldering copper layers, particularly in microelectronic applications, rosin fluxes are not required. This results in reduction or elimination of problems associated with the use of flux agents, such as disposal of chemical reagents, post reflow cleaning of flux residues, higher defect levels, high rework costs, and the like. In addition, problems associated with soldering metal layers which have a chemically very inert and difficult to remove oxide layer, such as aluminum, are absent, and harsh, corrosive flux agents required therefore are not necessary.

The present invention is advantageous over techniques requiring a flux agent not only for the above reasons. The present invention also allows for flexibility in selection of reflow conditions which are effective with the pretreated copper layer. Further, reflow can be conducted using existing equipment. For example, because the pre-treatment step converts oxide compounds present on the surface of the copper layer to oxyfluorides, which break up when the solder melts, reflow and joining can occur in an oxidizing (air) ambient. Soldering can also be conducted under an inert ambient, i.e., nitrogen, but providing a reducing ambient for soldering is not required. Similarly, reflow can occur at atmospheric pressure; a vacuum is not required. Thus, soldering can be conveniently conducted under conditions where a reducing atmosphere or a vacuum cannot be easily provided.

In addition, high temperatures are not required for successful reflow. The temperature can be adjusted to typical soldering temperatures for most electronic applications, for example about 200° C. to about 220° C. for eutectic PbSn solders. This is particularly advantageous when working with a microelectronic device because of the delicate nature of the substrate and other components. Thus damage to the components and the substrate can be eliminated or greatly reduced.

The process according to the present invention thus eliminates flux, flux dispensing, flux cleaning, flux cleaning solvents, and disposal of the spent chemicals. The process is flexible and reflow can occur even in an oxidizing or inert atmosphere, at low temperatures, and at atmospheric pressure using existing equipment. High throughput, reliable soldering process is provided, which does not damage the components to be soldered, nor the environment.

DESCRIPTION OF THE DRAWINGS

Other objects and advantages of the invention and the manner in which the same are accomplished will be more completely understood with reference to the detailed description and to the drawings in which.

DETAILED DESCRIPTION OF THE INVENTION

The present invention will be now described more fully hereinafter with reference to the accompanying drawings, in which a preferred embodiment of the invention is shown. This invention can, however, be embodied in many different forms and should not be construed as limited to the embodiment set forth herein; rather, applicants provide this embodiment so that this disclosure will be thorough and complete, and will fully convey the scope of the invention to those skilled in the art. Like characters refer to like elements throughout.

Figure 1:
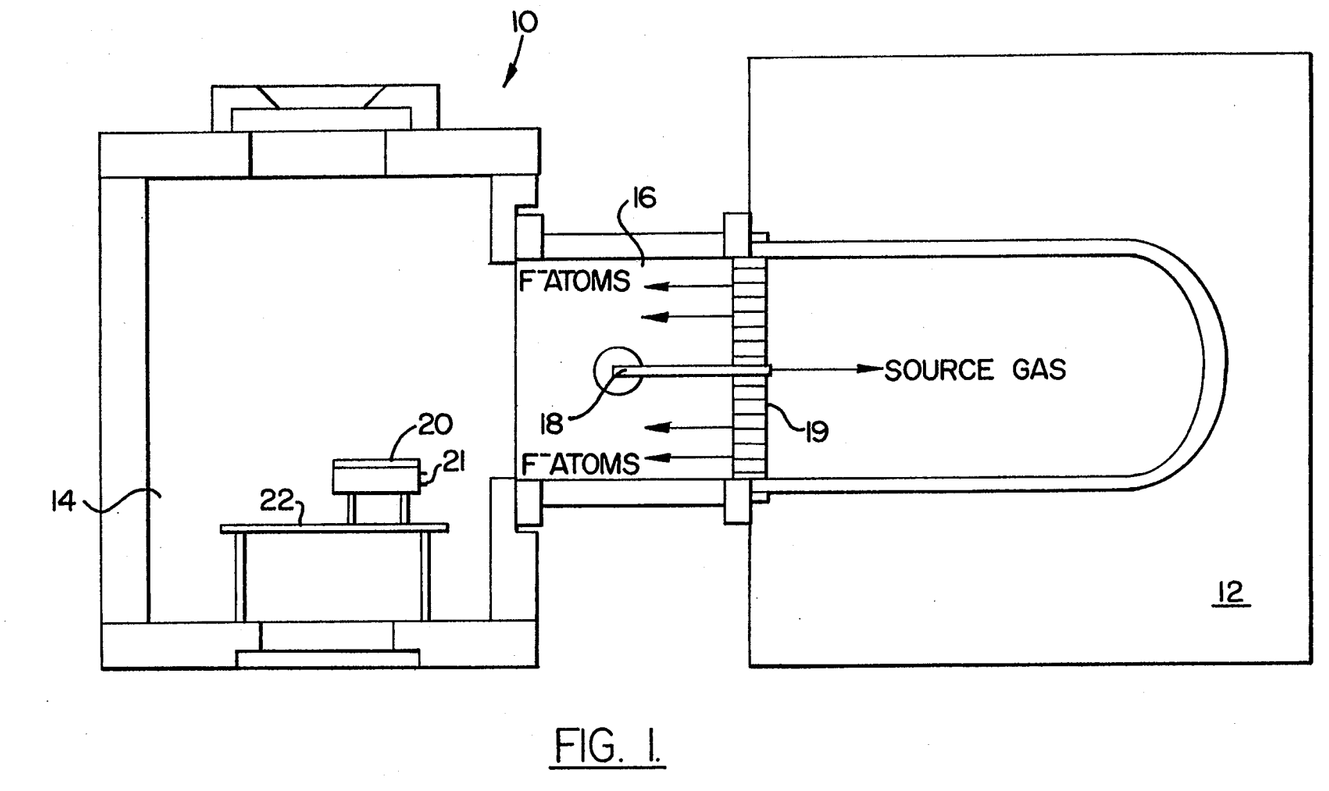
FIG. 1 schematically illustrates a side view of an apparatus for pre-treating a copper layer in a fluorine-containing plasma in accordance with the present invention.

FIG. 1 schematically illustrates a side view of a preferred copper layer pre-treatment apparatus 10 used in accordance with the present invention. As illustrated, pre-treatment apparatus 10 includes a plasma energy generating chamber 12, a sample treatment chamber 14, and a passageway 16 connecting chambers 12 and 14.

A fluorine-containing gas, such as $SF_6$, $CF_4$ and the like, is provided from gas supply line 18 into the plasma energy generating chamber 12. Here, energy is generated sufficient to disassociate the fluorine-containing gas to form atomic fluorine. The plasma energy may be generated using any of the techniques known in the art for creating a fluorine-containing plasma. In one advantageous embodiment of the invention, the plasma generating energy is provided from a microwave source, such as a microwave oven.

The disassociated fluorine atoms diffuse from the plasma energy generating chamber 12 through passageway 16 and into the sample reaction chamber 14. Preferably, a perforated aluminum plate 19 is provided between plasma energy generating chamber 12 and passageway 16. The aluminum plate contains the active plasma generation to within chamber 12 so the samples are not exposed to the plasma generating energies or temperatures. This also allows free flow of gases, so fluorine atoms can enter the sample chamber and react with the surface oxides on the sample. In addition, aluminum reacts very slowly with fluorine and passivates so fluorine atom concentration in the sample chamber 14 is maximized and very little fluorine is absorbed by the aluminum.

A copper sample which is to be exposed to the fluorine-containing gases is provided within sample chamber 14. As illustrated, the copper sample can be, for example, a copper layer 20 provided on a substrate 21 and having an exposed copper surface. Typically, the copper will be a microelectronic substrate, integrated circuit, or other such device, having solderable pads with an outer copper surface. As will be appreciated by the skilled artisan, the exposed copper surface includes copper oxide compounds.

Advantageously, the copper sample is placed on a sample stage 22, which can be thermally coupled to a heating means (not shown) for selectively adjusting the temperature of the stage, and thus the copper sample, prior to and during the pre-treatment step.

The surface of the copper layer 20 is pre-treated by exposing the copper surface to the gases from the fluorine-containing plasma. The plasma pre-treating process conditions are selected to provide the desired degree of exposure of the copper surface to fluorine atoms. Advantageously, conditions are selected so that the copper surface is exposed to fluorine atoms for a time sufficient so as to convert at least some of the copper oxide compounds present on the surface thereof to fluorine-containing compounds, i.e., copper oxyfluoride compounds, as explained in more detail below. Stated differently, the copper surface is exposed to the fluorine-containing plasma gases until sufficient fluorine-containing compounds form on the copper surface to permit subsequent wetting of solder to occur.

Preferably, the pre-treating exposing step is conducted to provide a fluorine/oxygen ratio on the copper surface of about 2/1 to about 8/1. Although the exact mechanism of the fluorine/oxygen interaction is not understood, tests have demonstrated that the pre-treatment of the copper layer in accordance with the invention is especially effective when the fluorine/oxygen ratio on the surface of the copper layer falls within this range. The exact ratio will vary according to the amount of copper surface oxides present prior to pre-treatment, the time of pre-treatment, the distance of the sample from the fluorine atom source, and the like.

The temperature of the copper layer can be varied during exposure to the fluorine atoms. For example, the pre-treatment of the copper layer can take place at room temperature (about 20° to 24° C.). Alternatively, pre-treatment may occur at elevated temperatures, i.e., the copper layer can be heated to a temperature up to about 120° C. or higher. Preferably, the plasma process is short in duration, i.e., about 2 to 30 minutes, and plasma pressures are from about 400 to 800 mTorr. Power level, gas flow, gas mixture and other typical plasma process conditions can vary according to the reactor configuration and the nature of the assembly to be treated.

Advantageously, a second plasma energy generating chamber (not illustrated) is coupled to the sample chamber 14 opposite plasma energy chamber 12, to provide a more thorough and equal distribution of the fluorine atoms onto the copper surface.

Although applicants do not wish to be bound by any theory, it is believed that exposing the copper layer, particularly copper oxide compounds on the surface of the copper layer, to fluorine atoms results in a reaction wherein copper oxyfluorides are formed on the surface of the copper layer. This effectively transforms surface oxides which prevent solder reflow or wetting of surfaces to be solder joined, and thus allows for effective soldering to take place without the need for fluxing agents, high temperatures, and the like. It is further believed that the activation energy needed for converting the oxides is supplied by excited fluorine radicals in the plasma which diffuse and hit the surface oxide, resulting in the formation of the fluoride compounds on the copper layer surface.

Following exposure of the copper layer 20 to the fluorine-containing plasma, the substrate 21 containing the copper layer is removed from the treatment chamber 14. Solder is then placed on the copper surface. The solder can be of any appropriate soldering material, such as tin, lead-tin, and lead-tin based alloys. Advantageously, the solder is an eutectic 63% tin, 37% lead material having a melting point of 183° C.

The solder is reflowed to form either a solder bump or to reflow and join a second surface. The second surface may be a component or another solder bump. Alternatively the copper surface can be dipped in a molten solder bath or wave and the copper surface "tinned" with the appropriate solder alloy. As noted with regard to plasma forming and exposing conditions above, the process conditions for reflow can be selected to optimize reflow. Thus reflow can be performed in an oxidizing atmosphere, i.e., air, or alternatively under an inert atmosphere, such as nitrogen. Similarly, reflow can take place under atmospheric pressure or under vacuum pressure conditions, although the latter is not necessary.

In addition, reflow can take place at temperatures just above the melting point of the solder. For example, using a 63/37 weight percent tin/lead material, reflow takes place just above the melting point of the solder of 183° C. at a temperature of about 200° C. to 220° C.

The present invention is subject to numerous variations. For example, the plasma pre-treatment step and the reflow process may occur simultaneously and/or the second surface may be brought in contact with the solder during reflow. In addition, copper samples can be pre-treated in the sample pre-treatment chamber, removed and stored for up to one week under an oxidizing ambient, i.e., air, and then transported for successful joining in a different facility. Alternatively, pre-treated copper samples can be stored for up two weeks in an inert ambient, i.e., nitrogen, and then subjected to reflow conditions.

Figures 2, 3:
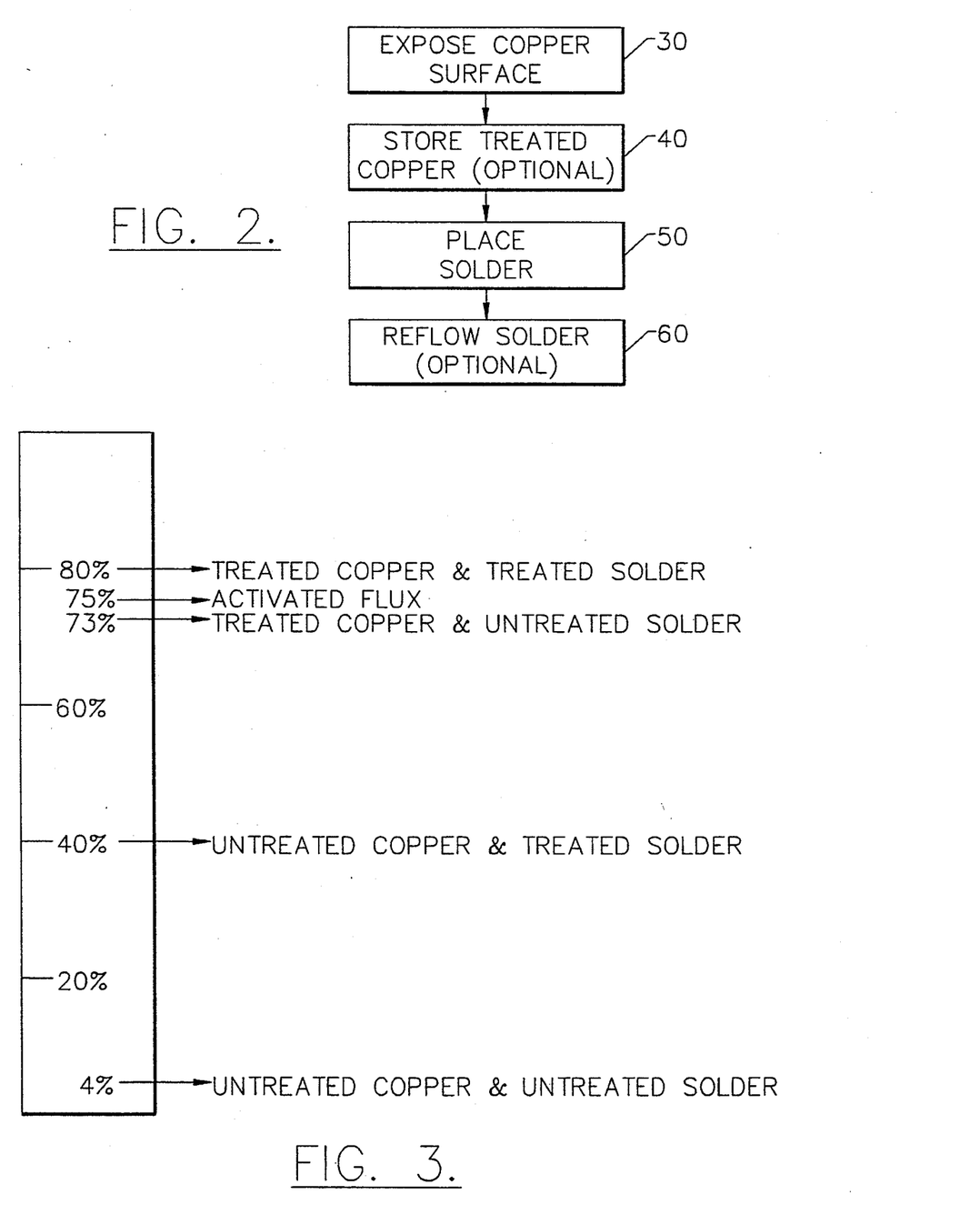
FIG. 2 is a flowchart illustrating operation of a process of the invention of pretreating a copper layer and fluxless soldering thereof.
FIG. 3 is a wetting index chart illustrating the degree of spreading of eutectic solder on treated and untreated copper layers.

Referring now to FIG. 2, a preferred process for pre-treating and fluxless soldering of a copper layer in accordance with the present invention is illustrated. A substrate which includes a copper layer having an exposed copper surface is provided. As illustrated in Block 30 of FIG. 2, the copper surface thereof is exposed to a fluorine-containing gas in a downstream microwave plasma. The plasma pre-treating process conditions of Block 30 are selected to provide the desired degree of exposure of the copper surface to fluorine atoms. As noted above, advantageously, conditions are selected so that the copper surface is exposed to fluorine atoms for a time sufficient so as to convert at least some of the copper oxide compounds present on the surface thereof to fluorine-containing compounds, i.e., copper oxyfluoride compounds. Preferably, the pre-treating exposing step is conducted to provide a fluorine/oxygen ratio on the copper surface of about 2/1 to about 8/1.

The exposure of the copper layer can take place at room temperature (about 20° to 24° C.). Alternatively, elevated temperatures can be used, i.e., the copper layer can be heated to a temperature up to about 120° C. or higher. Preferably, the plasma process is short in duration, i.e., about 15 to 30 minutes, and plasma pressures are from about 400 to 800 mTorr.

As indicated in Block 40, following exposure of the copper surface to a fluorine-containing plasma, the copper sample can optionally stored for up to one week under an oxidizing ambient, i.e., air. Alternatively, pre-treated copper samples can be stored for up two weeks in an inert ambient, i.e., nitrogen.

Solder is then placed on the copper surface as indicated in Block 50. In Block 60, following solder placement the solder is reflowed. Reflow can be performed in an oxidizing atmosphere, i.e., air, or alternatively under an inert atmosphere, such as nitrogen. Similarly, reflow can take place under atmospheric pressure or under vacuum pressure conditions, although the latter is not necessary. In addition, reflow can take place at temperatures just above the melting point of the solder. For example, using a 63/37 weight percent tin/lead material, reflow takes place just above the melting point of the solder of 183° C. at a temperature of about 200° C. to 220° C. As also described above, the reflow step can occur as part of a joining step.

The following examples are provided to illustrate a process of the invention but are not to be construed as limitations on the invention.

EXAMPLE 1

Comparison of Solder Spreading on Treated and Untreated Copper Surfaces

A matrix of experiments was run to characterize the spreading of 1 mm solder disks on bare copper coupons cut out of sheet copper. All samples pre-treated in accordance with the present invention were exposed to a fluorine-containing plasma under conditions of 800 mtorr for 15 minutes.

The testing was designed to determine the spreading index when the copper surfaces were pre-treated in accordance with the present invention. Of interest were (a) spreading of an untreated solder disk on treated copper; (b) spreading of a treated solder disk on untreated copper; and (c) spreading of a treated solder disk on treated copper.

The effect of heat during the pre-treatment was also investigated. Untreated samples and samples reflowed with flux were used as controls for determining the effectiveness of the treatment. Spreading testing was carried out in a hot stage using a slow ramp (about two minutes) under a nitrogen cover.

Rapid reflow in air was also tested. A copper coupon with a solder disk on it was dropped on a hot stage maintained at 235° C. to simulate a rapid reflow (dip) conditions. The heat-up time was on the order of a few seconds (less than five seconds).

Spreading was measured by the formula:

$$S=(1-h/D)\times 100;$$

where S is the spreading index, h is the solder height and D is the theoretical diameter of a perfect sphere of the 1 mm disk's solder volume. The best value of S is 100 and the worst zero.

The results obtained showed good wetting of copper by eutectic solder using the process of the present invention. FIG. 3 graphically illustrates the resultant wetting index of the samples. The scale is from 0 to 100. As seen from FIG. 3, the best spreading index was obtained when both the copper and the solder disk were given the optimal treatment (S approximately 80%), which was better than when activated flux was used (S approximately 75%). The spreading of untreated solder on treated copper (S approximately 73%) was also close to the results obtained for activated flux. The spreading of solder on copper coupons in air with rapid reflow was about 69%. Temperature of pre-treatment had a marginal effect on spreading.

Figure 4:
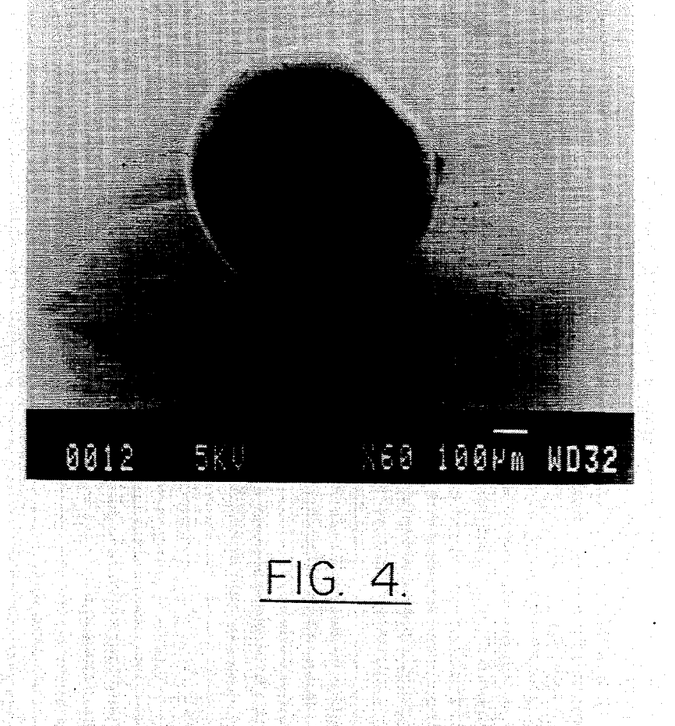
FIG. 4 is a scanning electron microphotograph (SEM) illustrating spreading of an untreated solder disk on untreated copper.
Figure 5:
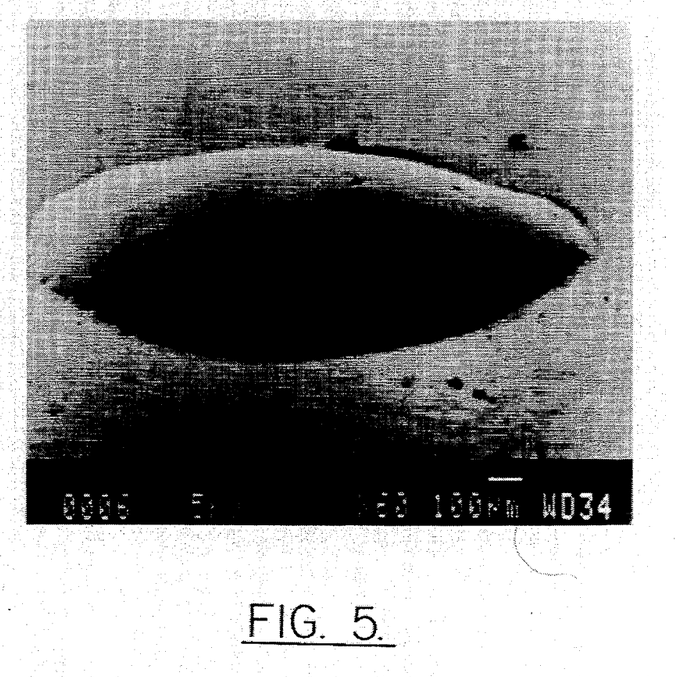
FIG. 5 is a scanning electron microphotograph illustrating spreading of an untreated solder disk on a treated copper layer in accordance with the present invention.

Scanning electron microphotographs of untreated and treated copper are shown in FIGS. 4 and 5, respectively. In FIG. 4, the solder and copper were untreated. The solder is still in the form of a ball and there is almost no spreading. In FIG. 5, the solder disk was untreated and the copper surface was treated. The solder is seen to spread out and wet the copper, and the spreading index increased from 4% to 73%. This illustrates that good solder spreading and wetting can be obtained when the copper surface alone is pretreated in accordance with the invention.

EXAMPLE 2

Rapid Reflow in Air (Dip) of Printed Circuit Boards

Rapid reflow was also tested on circuit boards with copper serpentine lines to cover a wider variety of samples. Standard test patterns were treated in accordance with the present invention. These patterns had bare copper serpentine pattern with 25 mil lines and 50 mil space. The size of the boards were 2" by 2" square. The test patterns with bare copper were cleaned in alconox soap solution followed by a rinse in hot water and isopropyl alcohol before the treatment. Plasma conditions as described in Example 1 above were used for treating the samples.

Treated samples were dipped halfway in a pot of eutectic solder. The pieces were held there for 10 seconds before pulling them out. All the reflows were done in air. Visual inspection was the only means used to characterize the effectiveness. The solder wet the copper completely forming a smooth uniform covering on the lines. The solder did not bridge any of the lines on the sample. On the other hand, the rapid reflow (dip) results of the control samples (untreated boards) were quite different. Solder is seen sticking at some points on the lines but the amount of solder is very minimal. No portion of the line is fully covered by solder. The performance of the control sample was very poor.

The test results of Example 2 illustrate the effectiveness of pre-treating the surface of a copper sample prior to reflow. When the copper surface is pretreated in accordance with the invention, solder reflows easily without requiring the use of fluxing agents. In contrast, when the copper surface is not pretreated, and reflow is attempted without the use of a fluxing agent, reflow and wetting of the solder is very poor.

EXAMPLE 3

Surface Characterization of Printed Circuit Boards

As noted above, it is believed that during plasma treatment of a copper sample, copper oxide compounds present on the surface of the copper layer are converted to copper oxyfluorocompounds, which allows fluxless soldering and wetting. One technique for judging the effectiveness of the process of the invention is in terms of fluorine to oxygen (F/O) ratio. This gives a truer picture than individual fluorine or oxygen concentrations, since the samples having different oxide thicknesses might pick up different amounts of fluorine.

Wavelength dispersive x-ray (WDX) was used in this study on the bare copper printed circuit boards. WDX gives the concentrations of fluorine and oxygen on the surface of the samples. Once the ratio of the oxygen and fluorine contents were obtained, they were compared with the master curve generated using 1 mm eutectic solder disk samples.

Printed circuit boards with bare copper were cleaned in alconox soap solution followed by a rinse in hot water and isopropyl alcohol. Pieces measuring 1 inch $\times$ 2 inch were cut from the board and pre-treated at room temperature and at 120° C. A small piece was cut for surface analysis and the remaining piece was dipped in a pot of eutectic solder in air at 235° C. The piece was held there for 10 seconds and then pulled out.

Figure 6:
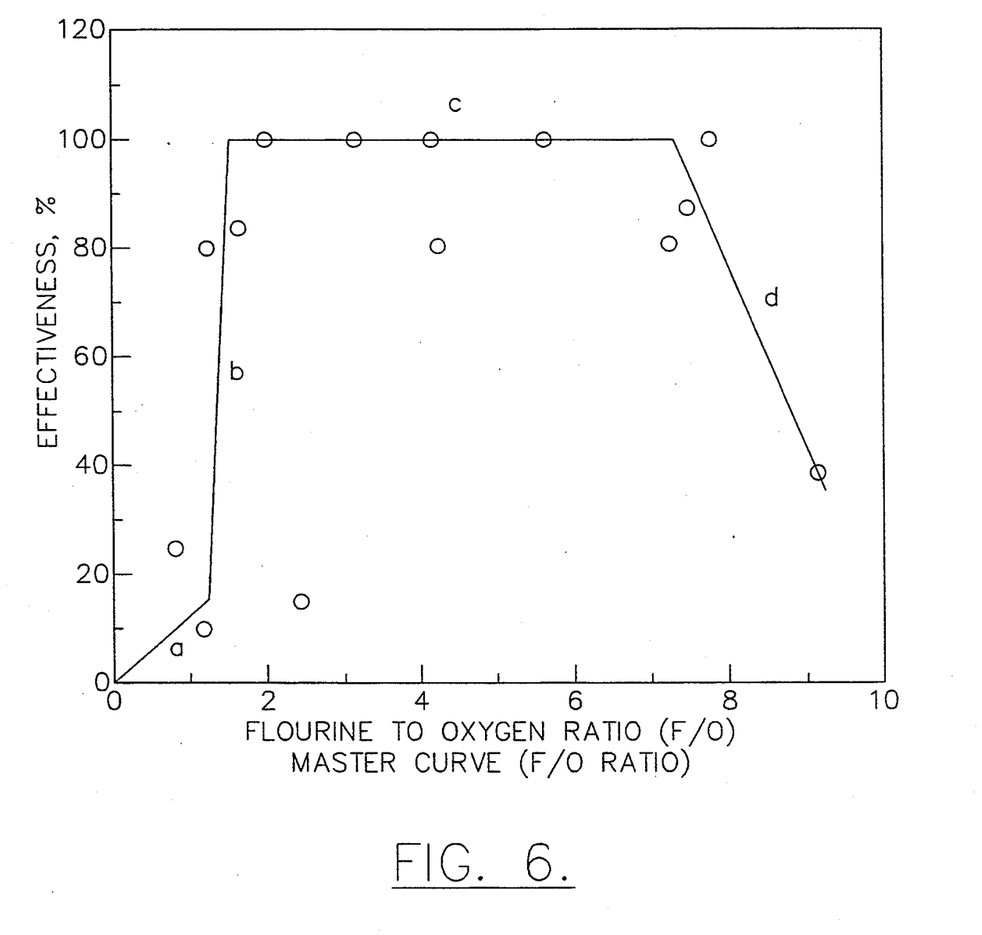
FIG. 6 is a graph illustrating the relationship of fluorine to oxygen ratio on the surface of a treated layer to the percent effectiveness of the pre-treatment.

Results for both the room temperature treatment and the 120° C. treatment were good. The F/O ratio for room temperature treatment was 2.77 and increased to 8.63 at 120° C. This increase in the ratio is not due to a significant increase in fluorine pickup but the decrease in oxygen concentration on the surface. Table 1 below gives the complete list of the treatment conditions and the results of the surface analysis. Almost all the ratios in Table 1 fall on the master curve as shown in FIG. 6. As seen from FIG. 6, the best range of operation to give 100% effectiveness is in the range of 2 and 8, i.e., a fluorine/oxygen ratio on the copper surface of about 2/1 to about 8/1. This is true for eutectic solder disks. For other samples, such as printed circuit boards which come in contact with untreated solder during the joining operation, a higher F/O ratio might be better.

TABLE 1

| | Concentrations of Oxygen, Fluorine and the Ratio of Fluorine to Oxygen | | |
|---|---|---|---|
| Treatment conditions | Fluorine wt % | Oxygen wt % | F/O ratio |
| 1 Alconox clean Cu printed circuit boards | — | 1.12 | — |
| 2 Clean Copper PCB pretreated at room temperature | 5.31 | 1.92 | 2.77 |
| 3 Clean Copper PCB pretreated at 120° C. | 5.89 | 0.68 | 8.63 |

In the drawings and specification, there have been disclosed typical preferred embodiments of the invention, and although specific terms are used, they are used in a generic and descriptive sense only and not for purpose of limitation, the scope of the invention being set forth in the following claims.

That which is claimed is:

1. A method of soldering a copper layer without the need for fluxing agents, comprising the steps of:
    exposing a copper layer having a copper surface to a fluorine-containing plasma; and
    placing solder on the copper surface of said copper layer.

2. The method of claim 1 wherein said copper surface has a surface oxide layer, and wherein said exposing step converts at least a portion of the surface oxides to fluorine-containing compounds.

3. The method of claim 2 wherein said exposing step is performed until sufficient fluorine-containing compounds form on said copper surface to permit solder wetting to occur.

4. The method of claim 2 wherein said exposing step results in a fluorine/oxygen ratio on said copper surface of about 2/1 to about 8/1.

5. The method of claim 1 wherein the following step is performed between said exposing step and said placing step:
    storing the exposed copper layer in an air ambient for a period of up to about one week.

6. The method of claim 1 wherein the following step is performed between said exposing step and said placing step:
    storing the exposed copper layer in an inert ambient for a period of up to about two weeks.

7. The method of claim 1 further comprising the step of reflowing said solder on the surface of said copper layer after said placing step.

8. The method of claim 7 wherein said reflowing step occurs at atmospheric pressure.

9. The method claim 7 wherein said reflowing step occurs in an oxidizing ambient.

10. The method of claim 7 wherein said reflowing step occurs in an inert ambient.

11. The method of claim 7 wherein said reflowing step comprises placing said solder in contact with a second surface to thereby solder join together said copper surface and said second surface without the need for post-soldering cleaning.

12. A method of soldering a copper layer without the need for fluxing agents, comprising the steps of:
    exposing a copper layer having a copper surface to a fluorine-containing plasma at a pressure from 400 mtorr to 800 mtorr and at a temperature from 20° C. to 120° C. for a period of 15 to 30 minutes; and
    placing solder on the copper surface of said copper layer.

13. The method of claim 12 wherein said exposing step results in a fluorine/oxygen ratio on said copper surface of about 2/1 to about 8/1.

14. The method of claim 12 wherein the following step is performed between said exposing step and said placing step:
    storing the exposed copper layer in an air ambient for a period of up to about one week.

15. The method of claim 12 wherein the following step is performed between said exposing step and said placing step:
    storing the exposed copper layer in an inert ambient for a period of up to about two weeks.

16. The method of claim 12 further comprising the step of reflowing said solder on the surface of said copper layer.

17. The method of claim 16 wherein said reflowing step occurs at a temperature of 200° C. to 220° C.

18. The method of claim 16 wherein said reflowing step occurs at atmospheric pressure.

19. The method claim 16 wherein said reflowing step occurs in an oxidizing ambient.

20. The method of claim 16 wherein said reflowing step occurs in an inert ambient.

21. The method of claim 16 wherein said reflowing step comprises placing said solder in contact with a second surface to thereby solder join together said copper surface and said second surface without the need for post-soldering cleaning.

22. A method of soldering a copper layer without the need for fluxing agents, comprising the steps of:
    exposing a copper layer having a copper surface to a fluorine-containing plasma at a pressure from 400 mtorr to 800 mtorr and at a temperature from 20° C. to 120° C. for a period of 15 to 30 minutes so that a fluorine/oxygen ratio on said copper surface of about 2/1 to about 8/1 results;
    placing solder on the copper surface of said copper layer; and
    reflowing said solder on the copper surface of said copper layer at a temperature of 200° C. to 220° C. at atmospheric pressure in an oxidizing ambient.

23. The method of claim 22 wherein said reflowing step comprises placing said solder in contact with a second surface to thereby solder join together said copper surface and said second surface without the need for post-soldering cleaning.

* * * * *